United States Patent
Sun et al.

(10) Patent No.: US 10,381,988 B2
(45) Date of Patent: Aug. 13, 2019

(54) METHODS AND APPARATUSES FOR RUGGEDIZING A POWER AMPLIFIER AGAINST BREAKDOWN USING HARMONIC TUNING

(71) Applicant: QUALCOMM Incorporated, San Diego, CA (US)

(72) Inventors: Yanjie Sun, Lexington, MA (US); Jing-Hwa Chen, Sudbury, MA (US); Zhenying Luo, Wayland, MA (US); Yan Kit Gary Hau, Westford, MA (US); Jisun Ryu, Marlborough, MA (US); Ashwin Duggal, Jamaica Plain, MA (US); Kihun Chang, Shrewsbury, MA (US); ZhenQi Chen, Shirley, MA (US); Xinwei Wang, Dunstable, MA (US); Xiangdong Zhang, Westford, MA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/706,242

(22) Filed: Sep. 15, 2017

(65) Prior Publication Data

US 2019/0089314 A1    Mar. 21, 2019

(51) Int. Cl.
| | | |
|---|---|---|
| H03F 3/191 | (2006.01) | |
| H03F 1/52 | (2006.01) | |
| H03F 1/56 | (2006.01) | |
| H03F 1/02 | (2006.01) | |
| H03F 3/24 | (2006.01) | |
| H03F 3/195 | (2006.01) | |
| H04B 1/04 | (2006.01) | |

(52) U.S. Cl.
CPC ............. *H03F 1/52* (2013.01); *H03F 1/0205* (2013.01); *H03F 1/565* (2013.01); *H03F 3/195* (2013.01);
(Continued)

(58) Field of Classification Search
CPC ........................................ H03F 3/191
(Continued)

(56) References Cited

U.S. PATENT DOCUMENTS

| 5,329,249 A | 7/1994 | Cripps |
| 5,434,540 A * | 7/1995 | Yamamoto ............ H03F 3/2176 330/207 A |

(Continued)

FOREIGN PATENT DOCUMENTS

| CN | 201726361 U | 1/2011 |
| CN | 201733278 U | 2/2011 |
| CN | 201898484 U | 7/2011 |

OTHER PUBLICATIONS

De La Rosa G., et al., "A GSM-EDGE Power Amplifier with a BiFET Current Limiting Bias Circuit" Radio Frequency Integrated Circuits Symposium, IEEE, 2009, pp. 595-598.
(Continued)

*Primary Examiner* — Henry Choe

(57) ABSTRACT

Certain aspects of the present disclosure provide methods and apparatus for operating a power amplifier. In one example, the apparatus includes a power amplifier configured to amplify an input signal having a frequency to produce a radio frequency (RF) output signal at an output and a harmonic tuning circuit coupled between a power supply and the power amplifier output, the harmonic tuning circuit configured to reduce a current or voltage provided to the power amplifier via a resonance at one or more harmonics of the frequency of the input signal.

23 Claims, 8 Drawing Sheets

(52) U.S. Cl.
CPC ....... H03F 3/245 (2013.01); *H03F 2200/171* (2013.01); *H03F 2200/225* (2013.01); *H03F 2200/318* (2013.01); *H03F 2200/387* (2013.01); *H03F 2200/391* (2013.01); *H03F 2200/411* (2013.01); *H03F 2200/426* (2013.01); *H03F 2200/451* (2013.01); *H04B 1/04* (2013.01)

(58) Field of Classification Search
USPC .................................................. 330/305, 302
See application file for complete search history.

(56) References Cited

U.S. PATENT DOCUMENTS

| 6,784,732 | B2* | 8/2004 | Hajimiri | H02M 7/48 330/207 A |
| 7,944,305 | B2* | 5/2011 | Knickerbocker | H03F 1/56 330/277 |
| 8,593,225 | B2* | 11/2013 | Hellberg | H03F 1/0205 330/277 |
| 8,907,723 | B2* | 12/2014 | Onizuka | H03F 1/56 330/207 A |
| 9,024,691 | B2* | 5/2015 | Banerjee | H03F 3/005 330/305 |
| 2005/0110572 | A1 | 5/2005 | Morimoto et al. | |
| 2017/0257070 | A1* | 9/2017 | Modi | H03F 3/19 |

OTHER PUBLICATIONS

Pfost M., et al., "Optimization of the Collector Profile of InGaP/GaAs HBTs for Increased Robustness", IEEE, Gallium Arsenide Integrated Circuit (GaAs IC) Symposium, 25th Annual Technical Digest, 2003, pp. 115-118.

\* cited by examiner

METHODS AND APPARATUSES FOR RUGGEDIZING A POWER AMPLIFIER AGAINST BREAKDOWN USING HARMONIC TUNING

TECHNICAL FIELD

Certain aspects of the present disclosure generally relate to electronic circuits and, more particularly, to circuits for ruggedizing power amplifier performance.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology), 4G, 5G, or later system, which may provide network services via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks. Other examples of wireless communication networks may include WiFi (in accordance with IEEE 802.11), WiMAX (in accordance with IEEE 802.16), and Bluetooth® networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

To transmit data and/or control information, the radio frequency front end of the base station and/or the mobile station may include one or more power amplifiers to amplify a radio frequency (RF) signal for transmission over an antenna. These power amplifiers may be exposed to voltage and/or current swing conditions as well as load mismatches that can exceed breakdown conditions of components of the power amplifiers. Accordingly, what is needed are methods and apparatus for ruggedizing power amplifiers against such breakdown conditions.

SUMMARY

Certain aspects of the present disclosure generally relate to techniques and apparatus for ruggedizing a power amplifier.

Certain aspects of the present disclosure provide for a power amplifier. The power amplifier generally includes a transistor configured to amplify an input signal having a frequency to produce an amplified radio frequency (RF) signal, a signal path configured to couple the amplified RF signal to an output of the power amplifier, and a choke path coupled between a power supply and the signal path, the choke path comprising a harmonic tuning circuit.

Certain aspects of the present disclosure provide for a method for operating a power amplifier in a transmit path. The method generally includes amplifying a first signal having a frequency via a power amplifier and reducing an amount of current or voltage provided to the power amplifier using a harmonic tuning circuit located in a choke path of the power amplifier, the harmonic tuning circuit coupled between the power amplifier and a supply line.

Certain aspects of the present disclosure provide for an apparatus for amplifying power. The apparatus generally includes a power amplifier configured to amplify an input signal having a frequency to produce a radio frequency (RF) output signal at an output and a harmonic tuning circuit located in a choke path of the power amplifier, the harmonic tuning circuit coupled between a power supply and the power amplifier output, the harmonic trap configured to reduce a current or voltage provided to the power amplifier via a resonance at one or more harmonics of the frequency of the input signal.

Certain aspects of the present disclosure provide for an apparatus for amplifying power. The apparatus generally includes means for amplifying a first signal having a frequency and means for reducing an amount of current or voltage provided to the means for amplifying using one or more impedances resonant at harmonics of the frequency, the means for reducing the amount of current or voltage being located in a choke path of the means for amplifying and coupled between a supply line and the means for amplifying.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
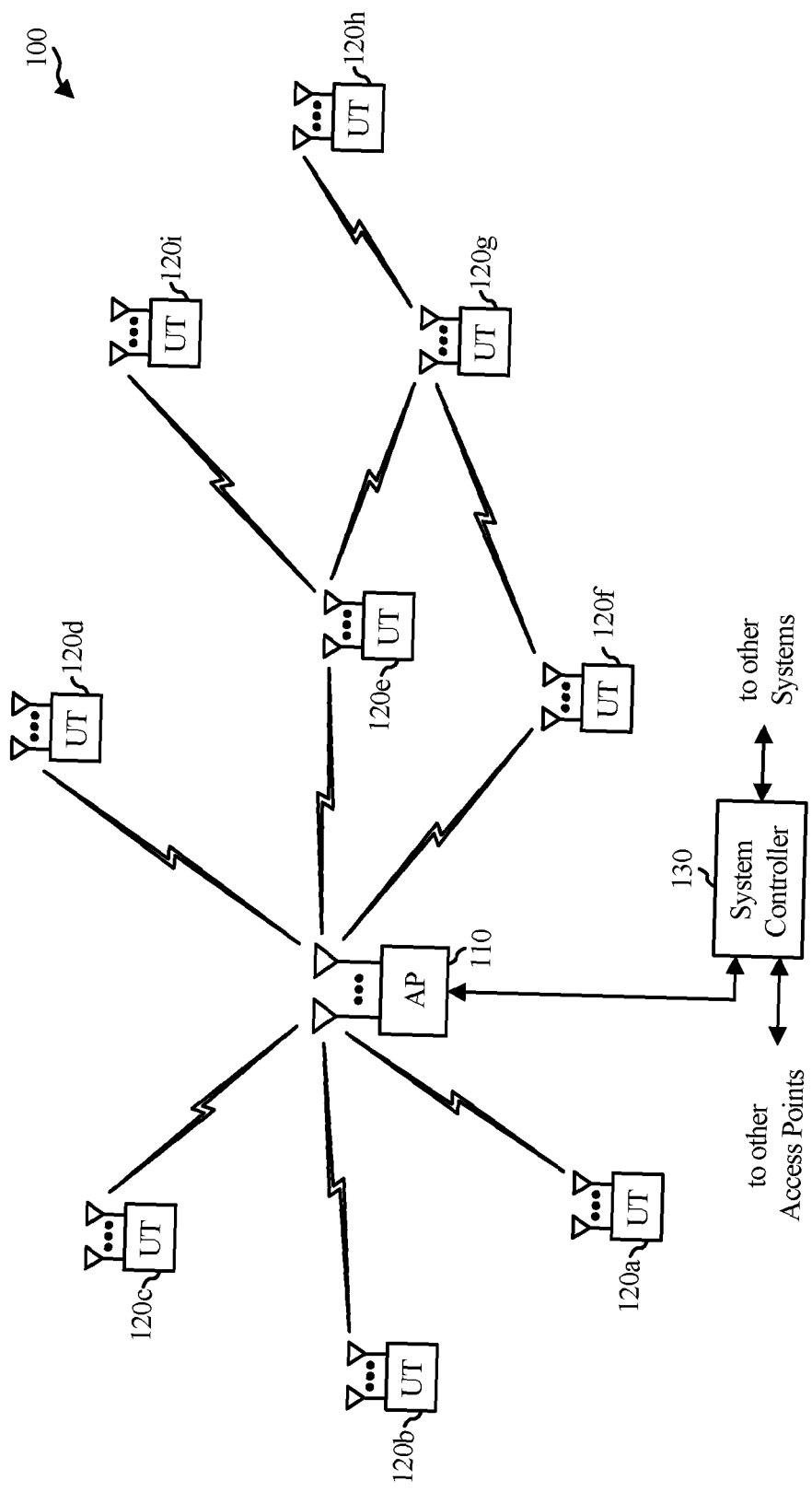
FIG. 1 is a diagram of an example wireless communications network, in accordance with certain aspects of the present disclosure.

FIG. 1 illustrates a wireless communications system 100 with access point 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more power amplifiers to amplify radio frequency (RF) signals used for signal transmission. At least one of the power amplifiers may include a harmonic trap implementing the techniques for ruggedizing a power amplifier to resist break down caused by, for example, voltage and/or current swings and load mismatch conditions, in accordance with certain aspects of the present disclosure.

Figure 2:
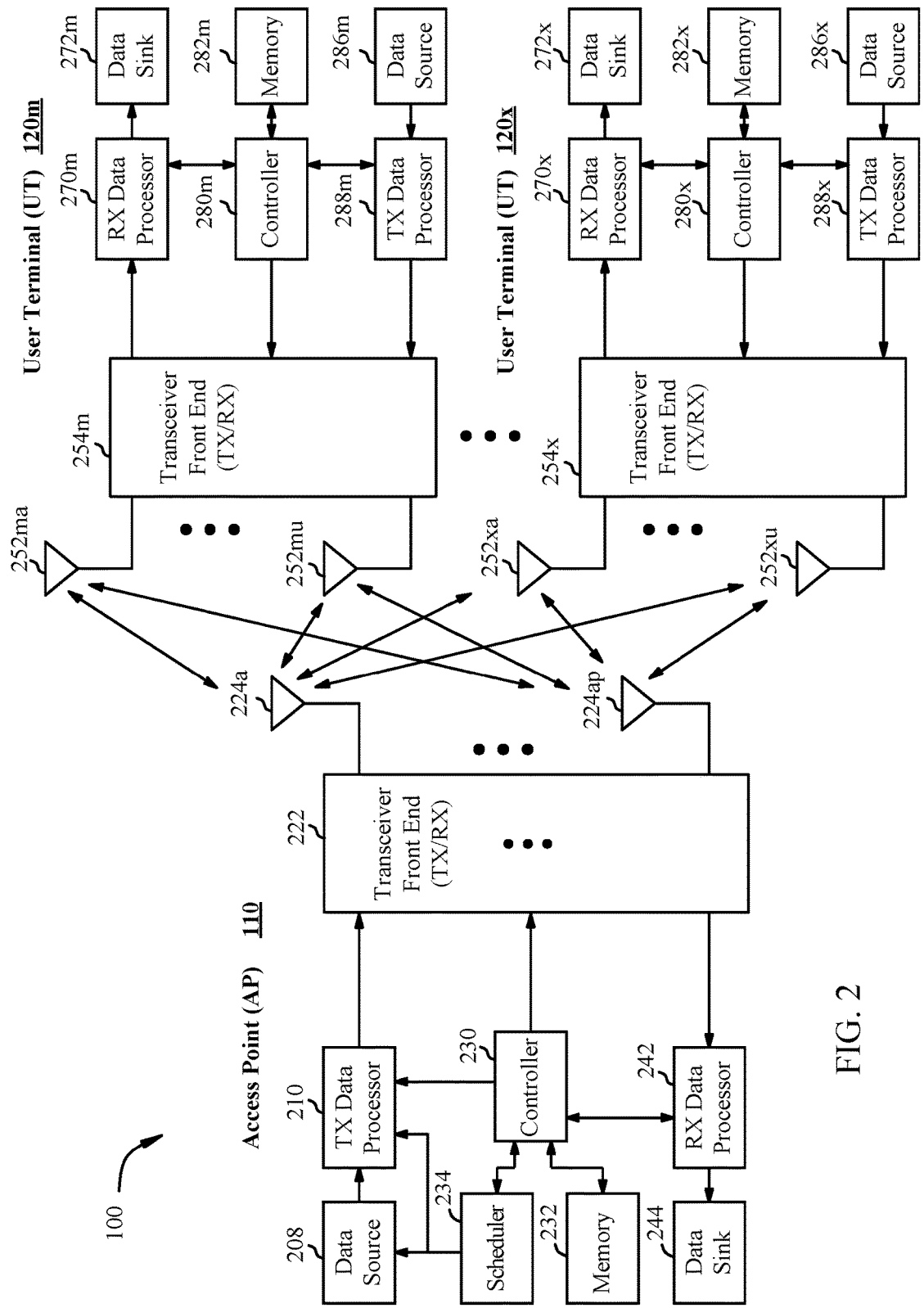
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{ap}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. At least one of the amplifier may include a harmonic trap implementing techniques for ruggedizing an amplifier to resist break down conditions caused by, for example, voltage and/or current swings and load mismatch conditions. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more frequency synthesizers to generate oscillating signals used for signal transmission and/or reception.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
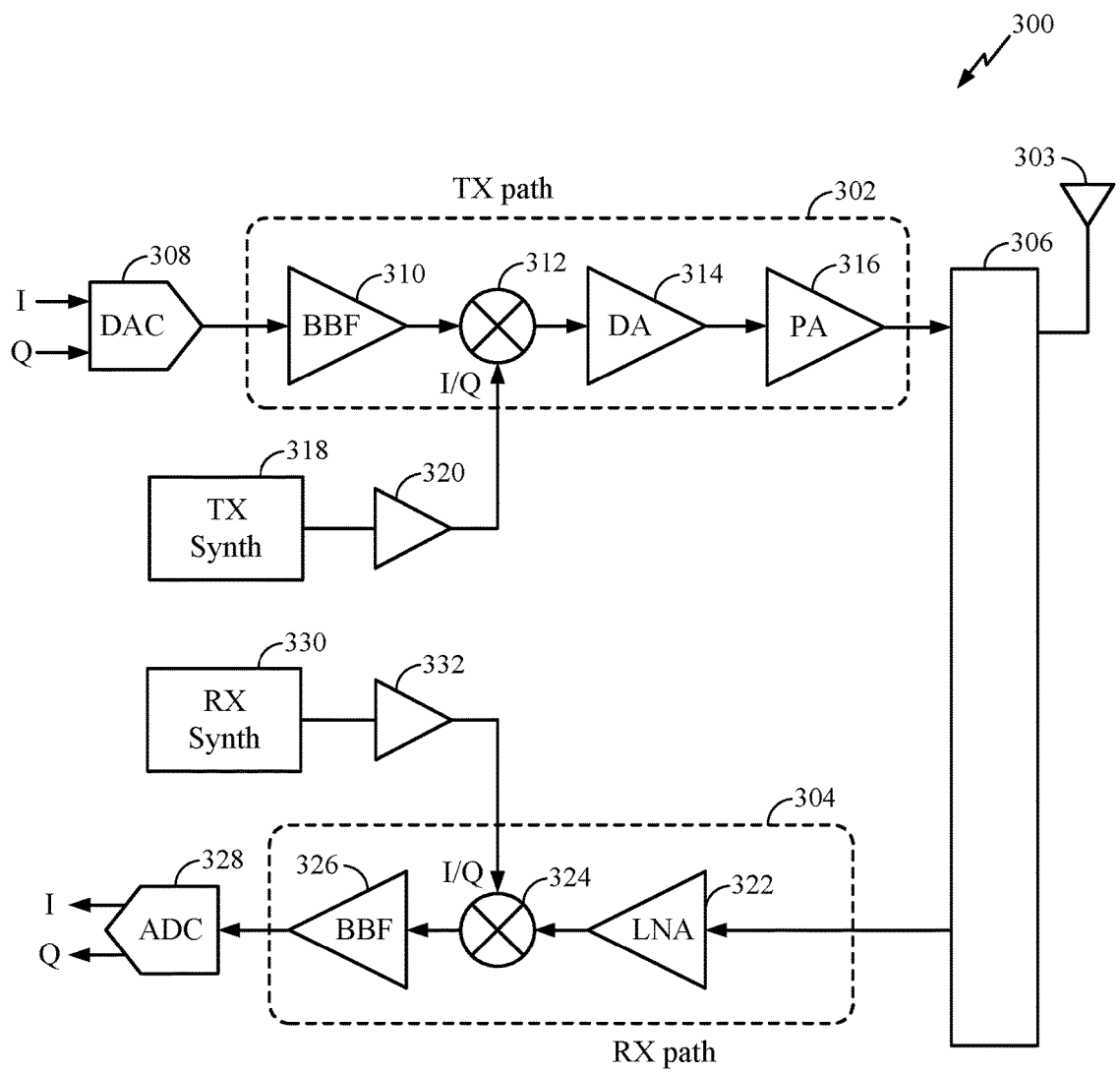
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). The transmit LO signal is provided by a transmit (TX) synthesizer 318 which may be buffered or amplified by an amplifier 320 prior to being fed to a mixer 312. This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

During operation, the PA 316 may be exposed to voltage/current swings as well as load mismatch conditions generating various levels of voltage standing wave ratios (VSWR). These conditions may threaten to exceed operational limits of components of the device eventually causing the components to break down. For example, the PA 316 may implement amplification via a bipolar junction transistor (BJT). If the collector terminal of the BJT is exposed to sufficient levels of voltage/current swing and/or VSWR condition, the breakdown voltage limit of the BJT may be exceeded.

The PA 316 may further comprise a harmonic trap implementing the techniques for ruggedizing PA 316 to resist break down caused by, for example, voltage and/or current swings and load mismatch conditions, in accordance with certain aspects of the present disclosure.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The receive LO signal is provided by an receive (RX) synthesizer 328 which may be buffered or amplified by an amplifier 332 prior to being fed to a mixer 324. The baseband signals output by the mixer 324 may be filtered by the BBF 326 before being converted by an analog-to-digital converter (ADC) 328 to digital I or Q signals for digital signal processing.

An Example Power Amplifier with Bias Clamping

In a saturation power amplifier, the impedance of the power amplifier may be tuned to inverse class F operation. The power amplifier may further have a second harmonic impedance configured to present open circuit impedance to the second harmonic of the frequency of operation of power amplifier located in the output path of the power amplifier to the antenna to boost maximum power and efficiency. Depending on the application of the power amplifier, the power amplifier may be configured to amplify at different maximum output powers. For example, in Global System for Mobile communications (GSM)-based systems, the maximum output power for different bands of operation may vary. Accordingly, for power amplifiers configured for bands requiring a higher amount of maximum output power, the power amplifier may be exposed to larger voltage and current swings due to VSWR loading conditions which may cause the power amplifier to exceed operational ratings, such as breakdown voltage. To protect the power amplifier from exceeding an operational rating from voltage and current swings, the power amplifier may implement circuitry to reduce the output power of the power amplifier or disable the power amplifier output, such as via bias clamping of a transistor of the power amplifier.

Figure 4:
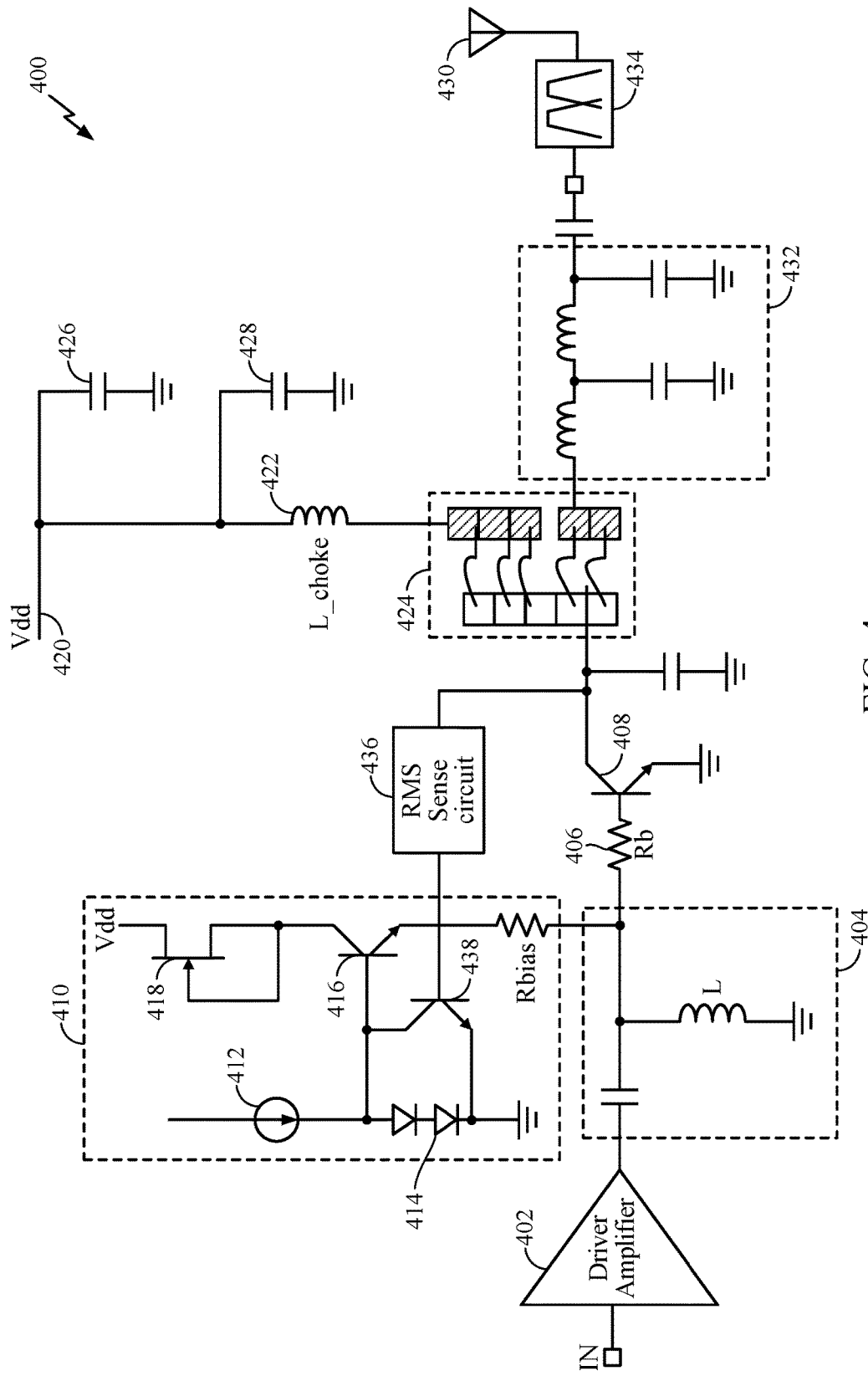
FIG. 4 is a schematic diagram of a prior art power amplifier with bias clamping.

Referring now to FIG. 4, a schematic diagram of a prior art topology 400 of an inverted class F power amplifier with bias clamping is shown. The topology includes a driver amplifier 402 connected to an inter-stage matching (ISM) circuit 404. The ISM circuit is further connected to a base resistor (Rb) 406 that is connected to the base terminal of amplification transistor 408. The topology 400 further includes bias circuitry 410 configured to supply a bias current to transistor 408 via base resistor 406. The bias circuitry 410 includes a current source 412 connected to a diode stack 414 to provide a bias current to the base terminal of the biasing transistor 416. The collector terminal of the biasing transistor 416 is connected to a supply rail (Vdd) via a pseudomorphic high-electron-mobility transistor (pHEMT) 418 while the emitter terminal is connected to a bias resistor (Rbias) that is connected to the base resistor 406. Accordingly, while the biasing transistor 416 is sufficiently biased, a bias current is supplied to amplification transistor 408. The amplification transistor 408 is further configured to have an emitter terminal connected to a ground and a collector terminal coupled to a supply rail (Vdd) 420 via a choke inductor 422 using bond wire interface 424. The path between the supply rail 420 and the choke inductor 422 further includes radio frequency (RF) bypass capacitors 426, 428. At least one of the RF bypass capacitors 426, 428 may be configured to reduce noise created by other power amplifiers, which may be operating in various bands, also connected to supply rail 420. The amplification transistor 408 is further coupled to an antenna 430 via an output matching stage 432 and filter 434.

In operation, the collector terminal of the amplification transistor 408 may experience voltage and/or current swings due to high VSWR conditions (e.g., 10:1) that may cause the breakdown voltage limit of the amplification transistor 408 to be exceeded. To protect the amplification transistor 408 from exceeding its breakdown voltage, the topology 408 further includes a root means square (RMS) sense circuit 436 coupled to the collector terminal of the amplification transistor 408. The RMS sense circuit 436 is configured to sense voltage and/or current swings and when the swing is sufficiently large, the RMS sense circuit 436 will assert a signal on the base terminal of a clamping transistor 438 to clamp the bias being provided to amplification transistor 408. When turned on via the asserted signal, the clamping transistor 438 is configured to effectively create a short circuit around diode stack 414 to ground, thereby causing the bias current being provided to biasing transistor 416 to be pulled to ground, thereby turning off the biasing transistor 416 and thus clamping the bias current of biasing transistor 416. In addition, the pHEMT 418 servers as a current clamping device by creating a sufficient voltage drop when a current exceeds a current limit thereby turning off transistor 416. Accordingly, the bias circuitry 410 stops providing a bias current to the amplification transistor 408 as no current is being provided by supply line Vdd. By reducing of the bias current to the amplification transistor 408, the collector current of the amplification transistor 408 is reduced thereby enhancing protection of the amplification transistor 408 from exceeding its breakdown voltage.

Example Power Amplifier with Harmonic Tuning

Power amplifiers implementing bias clamping topologies may implement a majority, if not all, of the protection circuitry on the power amplifier die. By implementing the protection circuitry on the die itself, additional die area is needed to implement the topology which may increase cost of the power amplifier. Furthermore, tuning of the protection circuitry may be difficult when implemented on die and may vary from die process to die process (e.g., from CMOS to GaAs). Accordingly, it would be beneficial to ruggedize the power amplifier with a reduced need for on-die protection circuitry.

Figure 5:
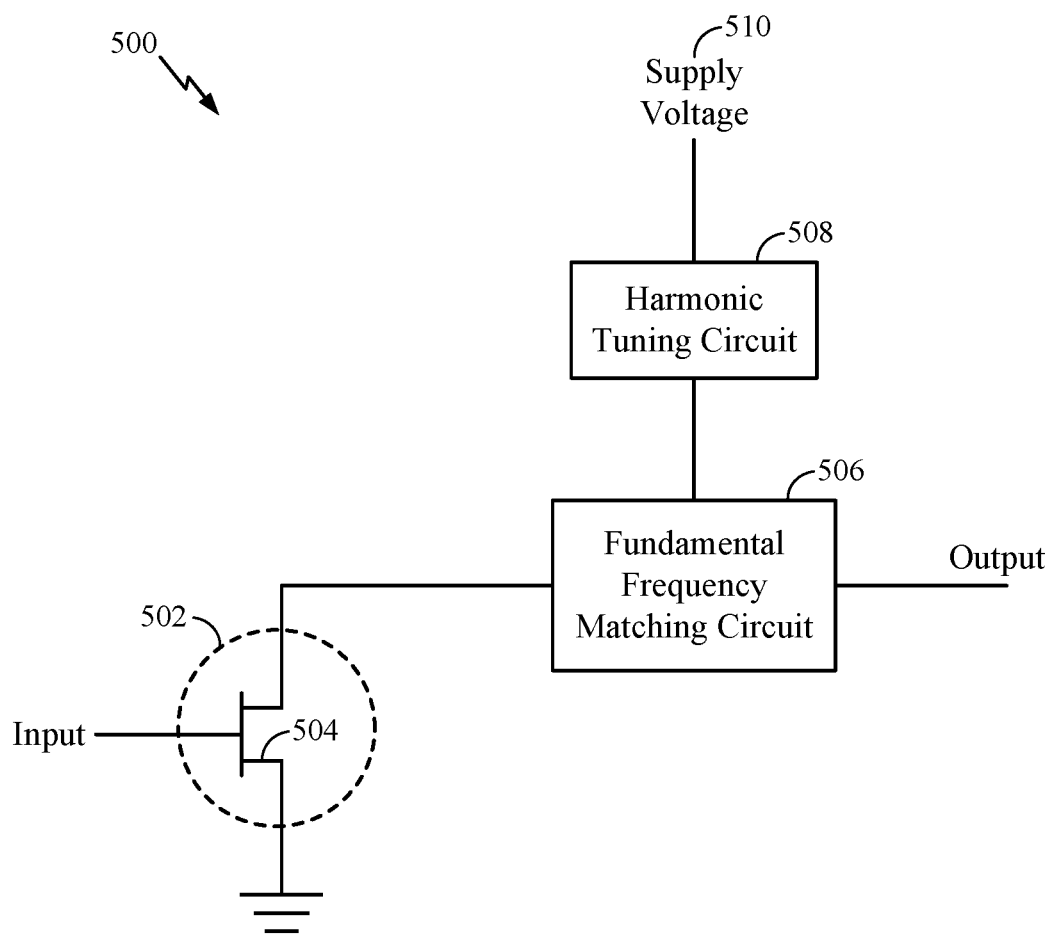
FIG. 5 is a generalized diagram of a power amplifier topology implementing harmonic tuning in accordance with certain aspect of the present disclosure.

FIG. 5 illustrates a generalized diagram of a power amplifier topology 500 implementing harmonic tuning in accordance with certain aspect of the present disclosure. The power amplifier topology 500 includes a power amplifier 502 comprising a transistor 504 coupled to a signal input. The transistor may be implemented according to a variety of transistor types such as a bipolar junction transistor (BJT), metal-oxide semiconductor field-effect transistor (MOSFET), or the like. The power amplifier 502 is configured to amplify an RF signal received via the signal input and output an amplified RF signal at the output. The power amplifier 502 is further coupled to a fundamental frequency matching circuit 506. The fundamental frequency matching circuit 506 is configured to form a resonant impedance at the output terminal of the transistor 504, where the resonant impedance is tuned to the fundamental operating frequency of the power amplifier 502. By forming a resonant impedance at the output terminal of the transistor 504, the voltage and current waveforms at the output terminal of the transistor 504 are formed to coincide less with each other thereby reducing power dissipated by transistor 504 and thus increasing efficiency. The resonant impedance formed may comprise a series resonant circuit, to form a short circuit at the fundamental operating frequency, or a parallel resonant circuit, to form an open circuit at the fundamental operating frequency, based on the class of power amplifier 502 being implemented (e.g., class F, inverted class F, etc.). The fundamental frequency matching circuit 506 may be implemented using any number of inductive and capacitive components as required by a particular design.

The power amplifier topology 500 further includes a harmonic tuning circuit 508 coupled to a supply voltage 510 and the output terminal of the transistor 504 via the fundamental frequency matching circuit 506. The harmonic tuning circuit 508 may also be referred to as a harmonic trap. The harmonic tuning circuit 508 is configured to resonate at one or more harmonics of the fundamental operating frequency of the power amplifier 502. For example, the harmonic tuning circuit 508 may be configured to form a parallel resonance at the second harmonic of the fundamental operating frequency. When the transistor 504 is operating in a deep saturation region, such as when the power amplifier 502 is being exposed to VSWR loading conditions, the output terminal current and voltage waveform of the transistor 504 may be determined mainly by the second and third harmonic impedance of the load line of the power amplifier 502. The harmonic impedance formed by the parallel resonance adjusts the harmonic impedance of the load line of the power amplifier 502 at a value between open and short to improve the ruggedness of the power amplifier 502 against voltage and/or current swings at the output terminal of the transistor 504 caused by, for example, VSWR load conditions. This improvement in ruggedness is achieved through the adjusted load line reducing the maximum current and/or voltage seen at the output terminal during VSRW loading by adjusting the current and voltage waveforms at the output terminal of the transistor 504.

In addition, the fundamental frequency matching circuit 506 may be designed such that the fundamental impedance of the load line remains substantially unaffected by the addition of the harmonic tuning circuit 508. In one implementation, the fundamental frequency matching circuit 506 includes an inductance (e.g., a choke inductor). The inductor of the fundamental frequency matching circuit 506 may be connected in parallel with the harmonic tuning circuit 508 which does not impart the fundamental load line impedance. By maintaining the fundamental load line impedance, the output power and efficiency of the power amplifier 502 remains largely unaffected by the addition of the harmonic tuning circuit 508.

While the harmonic tuning circuit 508 is shown in FIG. 5 to be coupled to the output terminal of the transistor 504 through the fundamental frequency matching circuit 506, it should be appreciated that one or more components of the harmonic tuning circuit 508 may be coupled directly to the output terminal of the transistor 504 without having to be coupled through one or more components of the fundamental frequency matching circuit 506.

Figure 6:
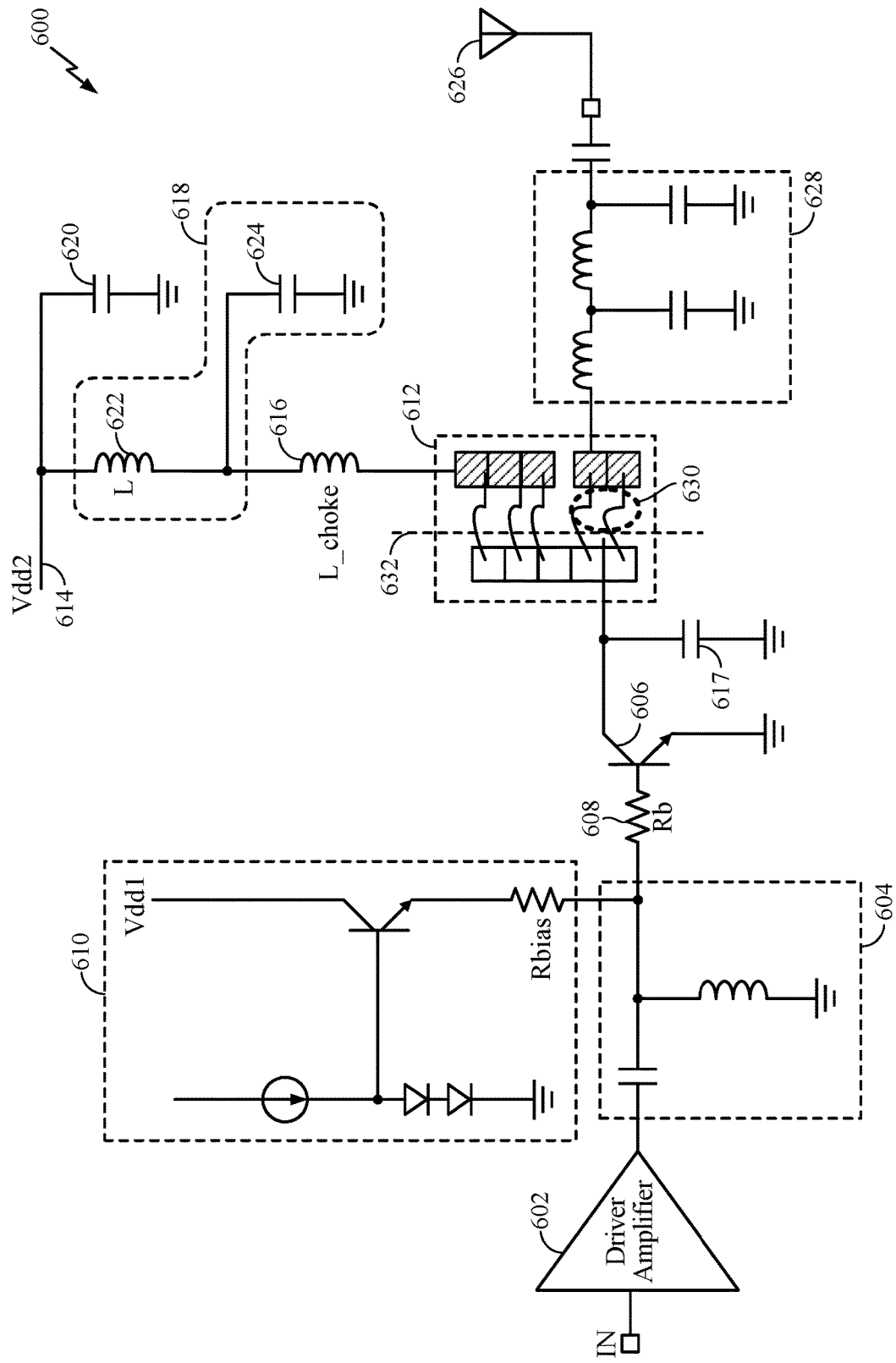
FIG. 6 is a schematic diagram of an exemplary power amplifier with harmonic tuning in accordance with aspects of the present disclosure.

Referring now to FIG. 6, schematic diagram of an example topology 600 of a transmit path including a power amplifier with harmonic tuning is shown in accordance with certain aspects of the present disclosure. The topology 600 includes a drive amplifier 602 coupled to a signal input and an inter-stage matching (ISM) circuit 604. The ISM circuit is coupled to a power amplifier, comprising an amplification transistor 606, via a base resistor (Rb) 608. The topology 600 further comprises biasing circuitry 610. The biasing circuitry 610 includes a current source coupled to a diode stack and a biasing transistor. The current source in combination with the diode stacks is configured to provide a bias current to the biasing transistor. The biasing transistor is further coupled to a supply line (Vdd1) and a bias resistor which provides a bias current for the amplification transistor 606. A collector terminal of the amplification transistor 606 is connected to a supply path via one or more bond wire connections of bond wire interface 612. The supply path is provided with a supply voltage (Vdd2) 614 and comprises a choke inductor 616, a harmonic tuning circuit 618, and an optional RF bypass capacitor 620. The path containing the choke inductor 616 and the harmonic tuning circuit 618 connected to the supply 614 and the bond wire interface 612 may be referred to as the choke path. However, it should be noted that the choke path may comprise additional components such as the optional RF bypass capacitor 620. The collector terminal may be further coupled to capacitor 617. In one implementation, the capacitor 617 and the choke inductor 616 are configured to form a parallel resonant impedance at a fundamental operating frequency of the power amplifier. This resonant impedance improves the efficiency of the power amplifier by shaping the voltage and current waveforms at the collector terminal to reduce overlap between the waveforms for decreased power dissipation by the amplification transistor 606. An output of the amplification transistor 606 is coupled to an antenna 626 via an output matching stage 628 via bond wires of the bond wire interface 612 at one or more bond wire connections 630. The output matching stage 628 may comprise one or more matching stages. In the illustrated output matching stage 628, two stages are implemented with each stage comprising a series inductor and a shunt capacitor which may increase bandwidth as compared to implementing only one stage. The path comprising the segment from the bond wire connections 630 to the antenna 626 may be referred to as the signal path. While the signal path in FIG. 6 is illustrated as containing the output matching stage 628, a direct current (DC) blocking cap, and an antenna 626, it should be noted that the signal path may contain differing amounts of components. For example, the signal path may further include one or more antenna tuners, filters, duplexers, and/or switches.

The harmonic tuning circuit 618 may comprise a tuning inductor 622 and a tuning capacitor 624. The tuning capacitor 624 is connected between a node located between the choke inductor 616 and tuning inductor 622 and ground. The tuning capacitor 624 in combination with the tuning inductor 622 is configured to form a parallel resonant impedance at a desired frequency. For example, the harmonic tuning circuit 618 may form a resonant impedance at one or more harmonic frequencies (e.g., second and/or third harmonics) of the fundamental operating frequency of the power amplifier. As the tuning capacitor 624 and tuning inductor 622 are configured as a parallel resonant impedance, the harmonic tuning circuit 618 will present an impedance to the one or more harmonic frequencies.

While the choke inductor 616 and tuning inductor 622 are illustrated as separate inductors, it should be appreciated that tuning inductor 622 and choke inductor 616 may comprise portions of a single inductor by tapping into a subset of the choke inductor 616 windings or coils (e.g., center tapping) where the tapping includes a coupling to capacitor 624 which is further coupled to ground.

The harmonic tuning circuit 618 adjusts the harmonic impedance of the load line of the power amplifier by presenting an impedance residing between an open and short circuit to the one or more harmonic frequencies. By adjusting the load line with such an impedance, the amount of current and/or voltage seen by the amplification transistor 606 under VSWR load conditions may be reduced thereby increasing ruggedness of the amplification transistor 606 to such load conditions. An example of this reduction is illustrated in the graphs of FIGS. 7A and 7B.

Figure 7A:
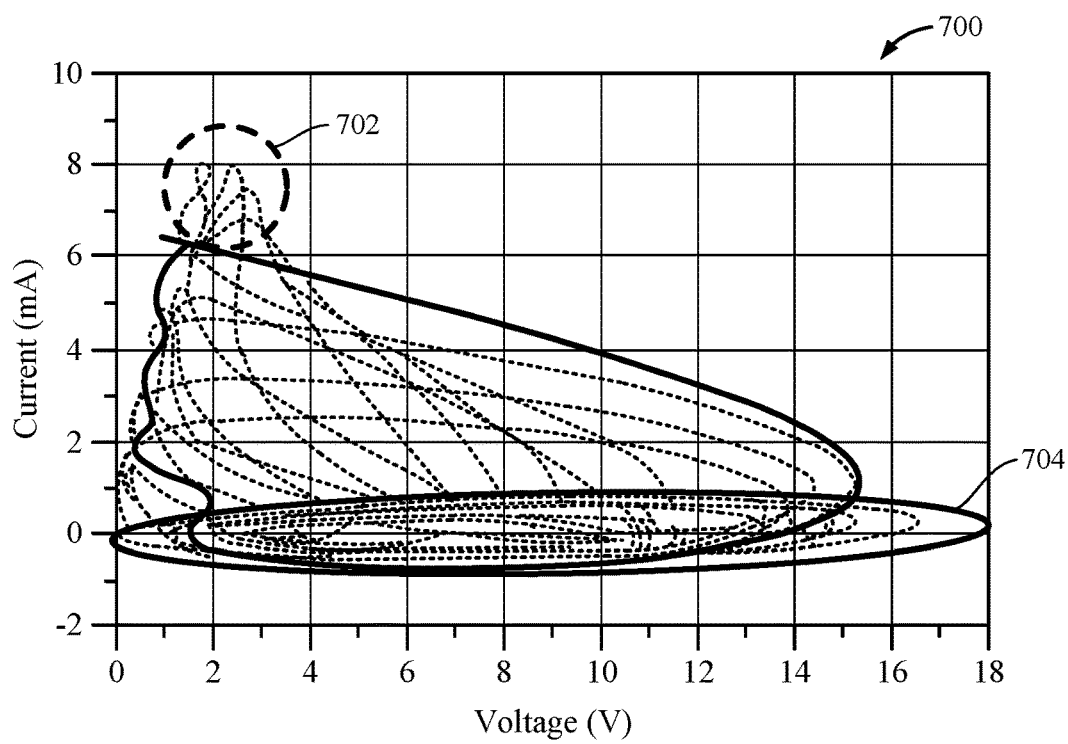
FIG. 7A is a graph illustrating voltage-current (V-I) curves of a power amplifier implemented without a harmonic tuning circuit.

FIG. 7A illustrates a graph 700 of voltage-current (V-I) curves of a power amplifier that does not implement a harmonic tuning circuit. Each V-I curve is associated with a VSWR phase (e.g., 60-degree phase). As can be seen, the power amplifier experiences a high current phase of approximately 8 milliamps (mA) in circle 702 and a maximum voltage of approximately 18 volts (V) at point 704.

Figure 7B:
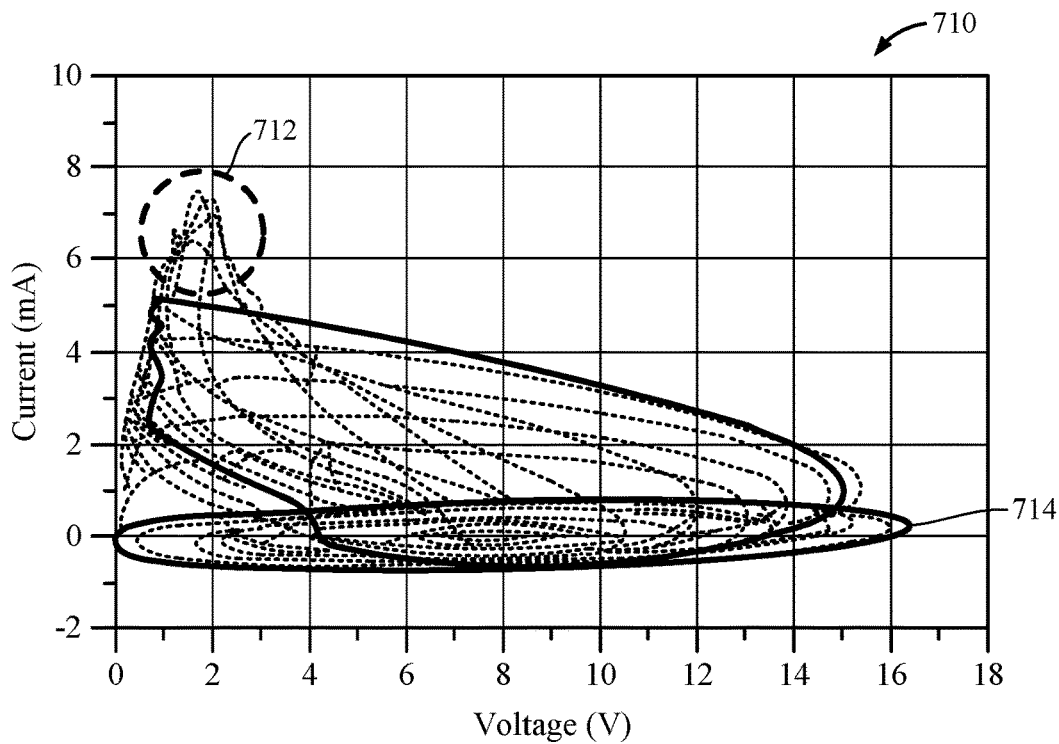
FIG. 7B is a graph illustrating voltage-current (V-I) curves of a power amplifier implementing a harmonic tuning circuit in accordance with aspects of the present disclosure

FIG. 7B illustrates a graph 710 of voltage-current (V-I) curves of a power amplifier implementing a harmonic tuning circuit in accordance with aspects of the present disclosure. In comparison to FIG. 7A, the power amplifier implementing the harmonic tuning circuit experiences a reduced high phase current of 7.5 mA in circle 712 and a reduced maximum voltage of approximately 16 V at point 714. By reducing the maximum amount of voltage and/or current seen by the power amplifier under various VSWR load conditions, the power amplifier may survive high VSWR conditions (e.g., 10:1) without the use of biasing clamping circuitry as shown in FIG. 4. By obviating the need for the bias clamping circuitry, the area required for the power amplifier circuitry may be reduced, such as on the die, which may reduce overall cost.

In one implementation, circuity appearing to the left of the line 632 may be implemented on a die using processes such as gallium arsenide (GaAs), complementary metal-oxide semiconductor (CMOS), silicon on insulator (SOI), or the like. Circuitry appearing to the right of the line 632 may be implemented on a laminate printed circuit board (PCB) or other suitable substrate and connected with the die using the bond wire interface 612. However, it should be appreciated that one or more components which are illustrated as being implemented on the laminate may be implemented on the die and vice versa. A benefit of implementing the harmonic tuning circuit on a laminate is that it enables ruggedization of the power amplifier independent of the die process used to construct the power amplifier (e.g., SOI, GaAs, etc.). In addition, the harmonic tuning circuit may experience less variation using a laminate implementation as compared to being implemented on die.

Figure 8:
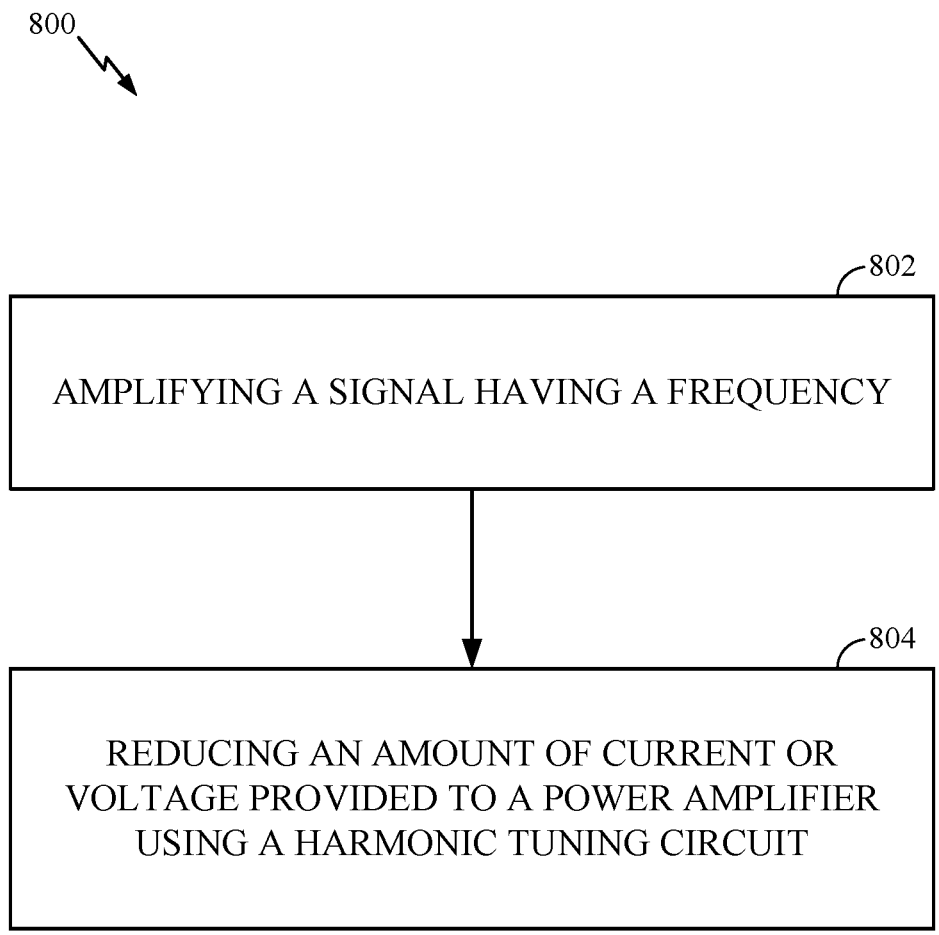
FIG. 8 is a flow diagram of example operations for reducing noise in an oscillating signal, in accordance with certain aspects of the present disclosure.

Referring now to FIG. 8, an example block diagram of a method for ruggedizing a power amplifier in accordance with aspects of the present disclosure is shown. At block 802, a signal having a frequency (i.e., a fundamental frequency) is amplified using a power amplifier. The signal may comprise an RF signal to be transmitted from a device, such as by user equipment (e.g., a mobile cellular phone). The RF signal may have a frequency compliant with a cellular standard (e.g., GSM, LTE, etc.) associated with a band of operation. During amplification, the power amplifier may experience a VSWR load condition which will reflect at least of portion of the amplified first signal back to an output of the power amplifier. This VSWR load condition may cause a current or voltage swing at the output terminal of the power amplifier depending on the phase of the reflected signal. For example, if the reflected signal is 180 degrees out of phase with the amplified RF signal, the voltage seen at the output terminal would be a combination of the peak voltages of the amplified RF signal and the reflected signal. Accordingly, the increased voltage and/or current seen at the output terminal may otherwise exceed a breakdown threshold of the power amplifier which may cause component damage.

At block 804, a current or voltage provided to the power amplifier is reduced using a harmonic tuning circuit. The current or voltage is reduced by the harmonic tuning circuit adjusting one or more harmonic impedances of the load line of the power amplifier. Frequencies of one or more harmonics are based on the fundamental frequency of operation of the power amplifier. By adjusting the one or more harmonic impedances of the load line, the maximum current and/or voltage seen by the power amplifier over a variety of VSWR load conditions (e.g., different phases of the reflected signal) may be reduced. This reduction in maximum voltage and/or current ruggedizes the power amplifier against exceeding potential breakdown conditions due to this reduction providing for increased breakdown margin. In one implementation, the harmonic tuning circuit comprises a parallel resonant circuit coupled between an output terminal of the power amplifier and a supply line. The parallel resonant circuit is configured to resonate at the one or more harmonics thereby presenting a desired impedance at the one or more harmonic frequencies.

Reducing the current or voltage provided to the power amplifier may further comprise attenuating one or more signals on the supply line within a frequency range using a choke inductor coupled between the harmonic tuning circuit and the power amplifier. The choke inductor may additionally form a portion of fundamental frequency matching circuit configured to resonate at the fundamental frequency of operation of the power amplifier to shape the voltage and current waveforms at the output terminal of the amplifier for increased power amplifier efficiency.

The various operations or methods described above may be performed by any suitable means capable of performing the corresponding functions. The means may include various hardware and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with an application specific integrated circuit (ASIC), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A power amplifier, comprising:
 a transistor configured to amplify an input signal having a frequency to produce an amplified radio frequency (RF) signal;
 a signal path configured to couple the amplified RF signal to an output of the power amplifier; and
 a choke path coupled between a power supply and the signal path, the choke path comprising a harmonic tuning circuit comprising a first inductor portion coupled to the power supply and a first capacitor having a first terminal coupled to the first inductor portion and a second terminal directly coupled to ground, the first capacitor being configured to form a parallel resonance with the first inductor portion;
 wherein the choke path further comprises a second inductor portion coupled between the first inductor portion and the signal path.

2. The power amplifier of claim 1, wherein the harmonic tuning circuit is configured to present an impedance at one or more harmonics of the frequency of the input signal.

3. The amplifier of claim 1, wherein the transistor comprises a bipolar junction transistor (BJT); and
 wherein the choke path and the signal path are coupled to a collector terminal of the BJT.

4. The power amplifier of claim 1, wherein the first inductor portion and the second inductor portion are implemented as a coil or winding, wherein the first capacitor is coupled to a center-tapped portion of the coil or winding.

5. The power amplifier of claim 1, wherein the choke path further comprises a second capacitor coupled to the power supply and the first inductor portion.

6. The power amplifier of claim 1, wherein the parallel resonance is configured to resonate at a second or third harmonic of a fundamental frequency of the input signal.

7. The power amplifier of claim 1, wherein the signal path comprises at least one matching network.

8. The power amplifier of claim 1, wherein the transistor is implemented on a die and the choke path is implemented on a laminate to which the die is coupled.

9. The power amplifier of claim 8, wherein the die comprises a gallium arsenide-based (GaAs) die.

10. A method for operating a power amplifier, the method comprising:
 amplifying a signal having a frequency via a power amplifier; and
 reducing an amount of current or voltage provided to the power amplifier using a harmonic tuning circuit located in a choke path of the power amplifier, the harmonic tuning circuit coupled between the power amplifier and a supply line;
 wherein reducing the amount of current or voltage comprises attenuating the current or voltage at one or more harmonics of the frequency by presenting a harmonic impedance between an open and short to the power amplifier using a parallel resonance circuit of the harmonic tuning circuit formed using an inductor and a shunt capacitor.

11. The method of claim 10, wherein the power amplifier resides on a die and the harmonic tuning circuit resides on a laminate coupled to the die.

12. The method of claim 10, the method further comprising attenuating one or more signals on the supply line within a frequency range using a choke inductor coupled between the inductor and the power amplifier.

13. The method of claim 12, wherein the inductor comprises a portion of the choke inductor.

14. An apparatus for amplifying power, the apparatus comprising:
   a power amplifier configured to amplify an input signal having a frequency to produce a radio frequency (RF) output signal at an output; and
   a harmonic tuning circuit located in a choke path of the power amplifier, the harmonic tuning circuit coupled between a power supply and the power amplifier output, the harmonic tuning circuit configured to reduce a current or voltage provided to the power amplifier via a resonance at one or more harmonics of the frequency of the input signal by presenting a harmonic impedance between an open and short to the power amplifier using a parallel resonance circuit of the harmonic tuning circuit formed using an inductor and a shunt capacitor.

15. The apparatus of claim 14, wherein the inductor is coupled between the power supply and the power amplifier, and the shunt capacitor is coupled at a node located between the inductor and the power amplifier.

16. The apparatus of claim 14, further comprising a choke inductor coupled in series between the inductor and the output of the power amplifier.

17. The apparatus of claim 14, wherein the power amplifier resides on a die and the harmonic tuning circuit resides on a laminate coupled to the die.

18. The apparatus of claim 17, wherein the laminate further comprises one or more matching circuits coupled between the output of the power amplifier and an antenna.

19. The apparatus of claim 14, wherein the current or voltage is reduced during one or more voltage standing wave ratio (VSWR) load conditions.

20. An apparatus for amplifying power, the apparatus comprising:
   means for amplifying a first signal having a frequency; and
   means for reducing an amount of current or voltage at one or more harmonics of the frequency provided to the means for amplifying by presenting a harmonic impedance between an open and short to the means for amplifying using a parallel resonance circuit of the means for reducing formed using an inductor and a shunt capacitor, the means for reducing the amount of current or voltage being located in a choke path of the means for amplifying and coupled between a supply line and the means for amplifying.

21. The apparatus of claim 20, the apparatus further comprising means for attenuating one or more signals on the supply line within a frequency range;
   wherein the means for attenuating is coupled between the means for reducing the amount of current or voltage and the means for amplifying.

22. The apparatus of claim 20, the apparatus further comprising means for matching an impedance between the means for amplifying and an antenna.

23. The apparatus of claim 20, wherein the means for amplifying resides on a die and the means for reducing the amount of current or voltage resides on a laminate coupled to the die.

* * * * *